US010557867B2

(12) United States Patent
Teranishi et al.

(10) Patent No.: US 10,557,867 B2
(45) Date of Patent: Feb. 11, 2020

(54) PROBE PIN AND INSPECTION DEVICE INCLUDING PROBE PIN

(71) Applicant: OMRON Corporation, Kyoto-shi, Kyoto (JP)

(72) Inventors: Hirotada Teranishi, Osaka (JP); Takahiro Sakai, Moriyama (JP)

(73) Assignee: OMRON Corporation, Kyoto-shi (JP)

( * ) Notice: Subject to any disclaimer, the term of this patent is extended or adjusted under 35 U.S.C. 154(b) by 0 days.

(21) Appl. No.: 15/759,244

(22) PCT Filed: Jan. 5, 2017

(86) PCT No.: PCT/JP2017/000172
§ 371 (c)(1),
(2) Date: Mar. 12, 2018

(87) PCT Pub. No.: WO2017/141561
PCT Pub. Date: Aug. 24, 2017

(65) Prior Publication Data
US 2018/0340957 A1  Nov. 29, 2018

(30) Foreign Application Priority Data
Feb. 15, 2016  (JP) .................. 2016-026060

(51) Int. Cl.
*G01R 1/067* (2006.01)
*H01R 13/24* (2006.01)

(52) U.S. Cl.
CPC ..... *G01R 1/06722* (2013.01); *G01R 1/06738* (2013.01); *H01R 13/2407* (2013.01); *H01R 2201/20* (2013.01)

(58) Field of Classification Search
CPC ........................... G01R 1/6722; G01R 1/6738; H01R 2201/20; H01R 13/2407
See application file for complete search history.

(56) References Cited

U.S. PATENT DOCUMENTS 7,845,988 B2 * 12/2010 Hsiao ................. H01R 13/2421
439/66
8,547,128 B1 * 10/2013 Sochor ............... G01R 1/06722
324/750.25

(Continued)

FOREIGN PATENT DOCUMENTS

JP    2010-539672 A    12/2010
JP    2011-33410 A     2/2011

(Continued)

OTHER PUBLICATIONS

English translation of the International Search Report of PCT/JP2017/000172 dated Mar. 7, 2017.

(Continued)

*Primary Examiner* — Dominic E Hawkins
(74) *Attorney, Agent, or Firm* — Metrolex IP Law Group, PLLC

(57) ABSTRACT

A probe pin includes an elastic hollow cylinder that expands and contracts along a central axis, a conductive first plunger extending in the cylinder along the central axis from a first end of the cylinder, and a conductive second plunger extending in the cylinder along the central axis from a second end of the cylinder. The first and second plungers are coupled together in the cylinder in a manner movable relative to each other along the central axis. The first plunger includes a first plunger body contained in the cylinder, and a first terminal connected to the first plunger body and located outside the cylinder. The second plunger includes a second plunger body contained in the cylinder, and a second terminal connected to the second plunger body and located outside the cylinder. The first plunger body includes a slope that tapers in a direction from an outer side toward an inner side of the cylinder, comes in contact with the second plunger body inside the cylinder, and is urged in a direction crossing the central axis by relative movement of the first and second (Continued)

plungers. The first plunger body includes a deformable elastic portion between the first terminal and the slope.

7 Claims, 15 Drawing Sheets

(56) References Cited

U.S. PATENT DOCUMENTS

| | | | |
|---|---|---|---|
| 8,721,372 B2* | 5/2014 | Hasegawa | G01R 1/0483 439/66 |
| 2007/0018666 A1* | 1/2007 | Barabi | G01R 1/06722 324/754.14 |
| 2008/0064236 A1 | 3/2008 | Lin et al. | |
| 2009/0075529 A1* | 3/2009 | Johnston | H01R 13/2421 439/824 |
| 2009/0253313 A1* | 10/2009 | Hsiao | H01R 13/2421 439/786 |
| 2010/0123476 A1* | 5/2010 | Kazama | G01R 1/06722 324/755.01 |
| 2017/0074903 A1* | 3/2017 | Teranishi | H01R 13/2407 |

FOREIGN PATENT DOCUMENTS

| | | |
|---|---|---|
| JP | 2015-169527 A | 9/2015 |
| WO | 2008136396 A1 | 11/2008 |

OTHER PUBLICATIONS

English translation of the Written Opinion of PCT/JP2017/000172 dated Mar. 7, 2017.
Office action dated Jul. 2, 2019 in a counterpart Japanese patent application.

* cited by examiner

FIG. 4A
FIG. 4B
FIG. 4C
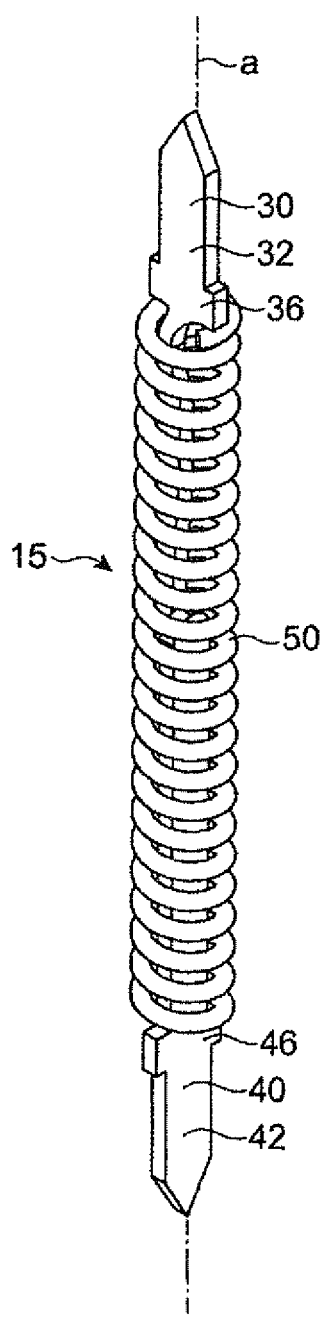
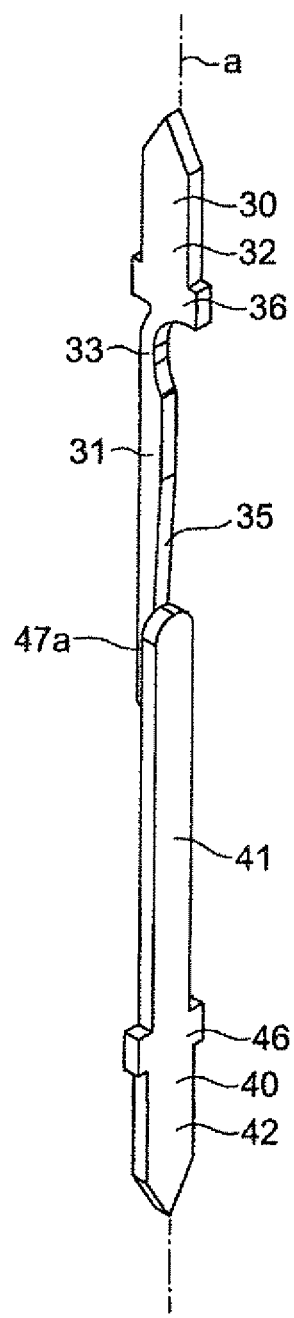
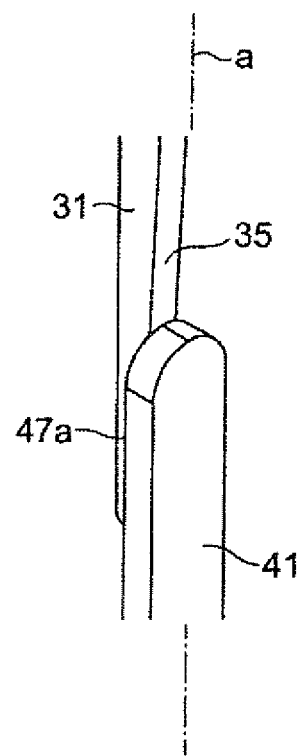
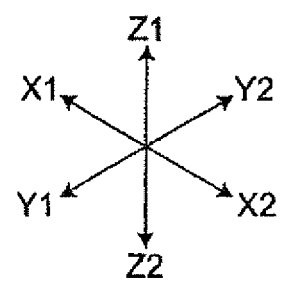

FIG. 6A  FIG. 6B  FIG. 6C
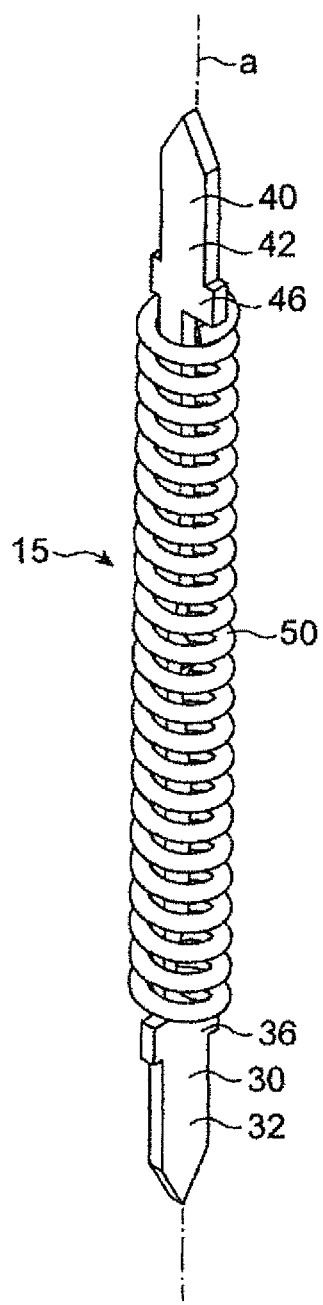
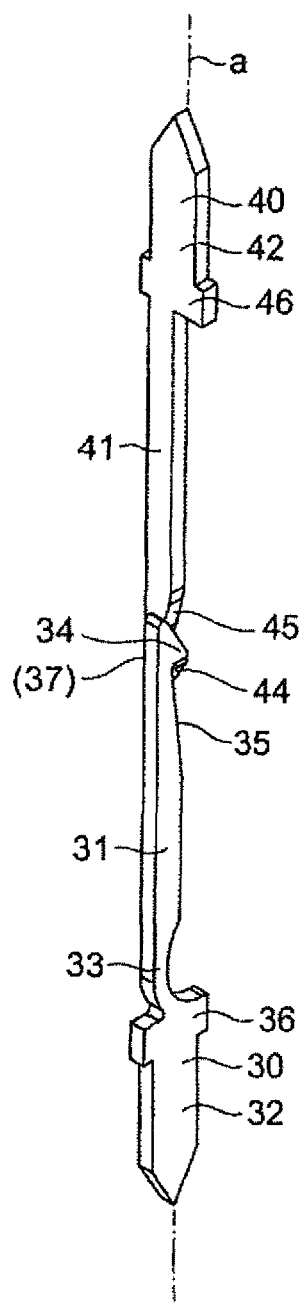
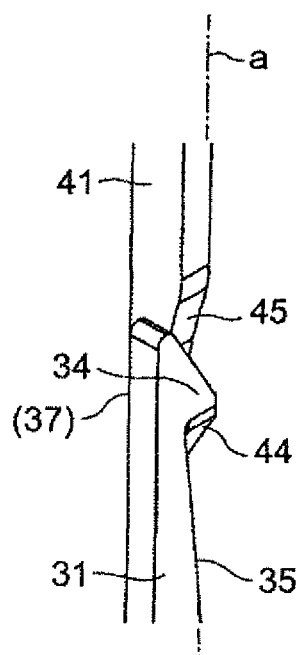
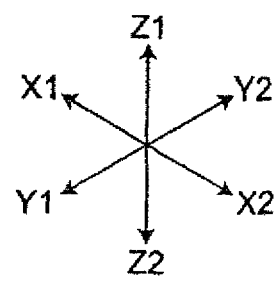

FIG. 8A
FIG. 8B
FIG. 8C
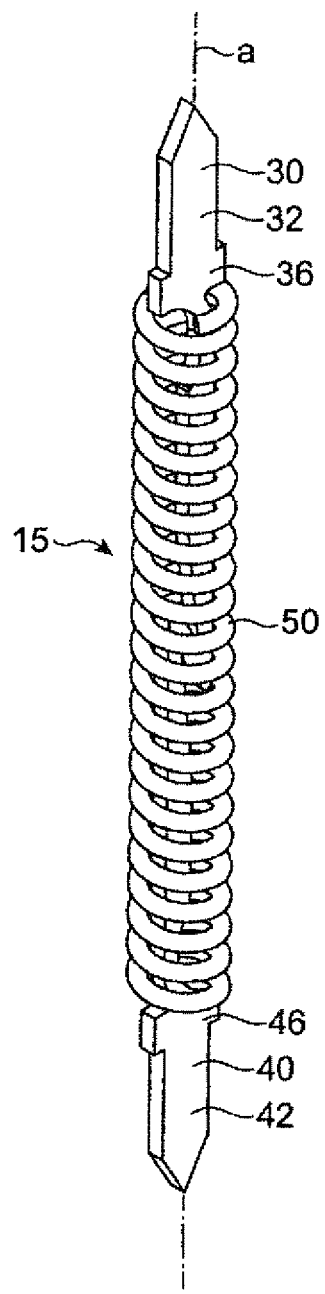
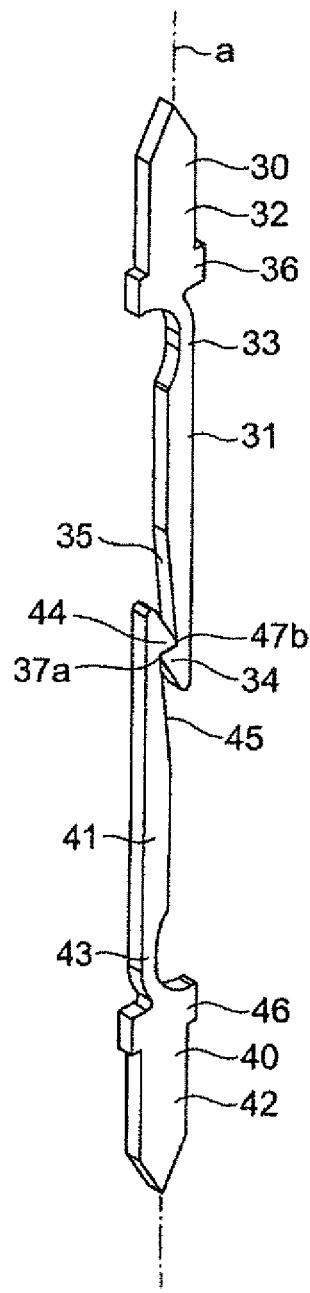
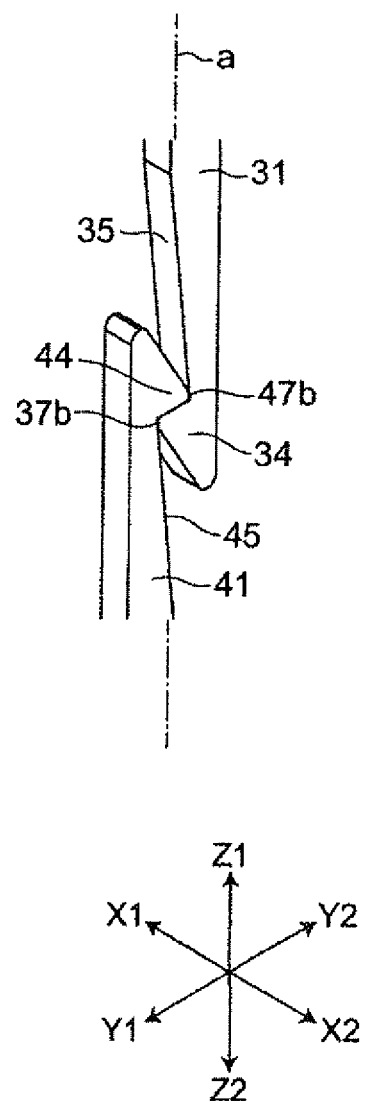

FIG. 10A    FIG. 10B    FIG. 10C
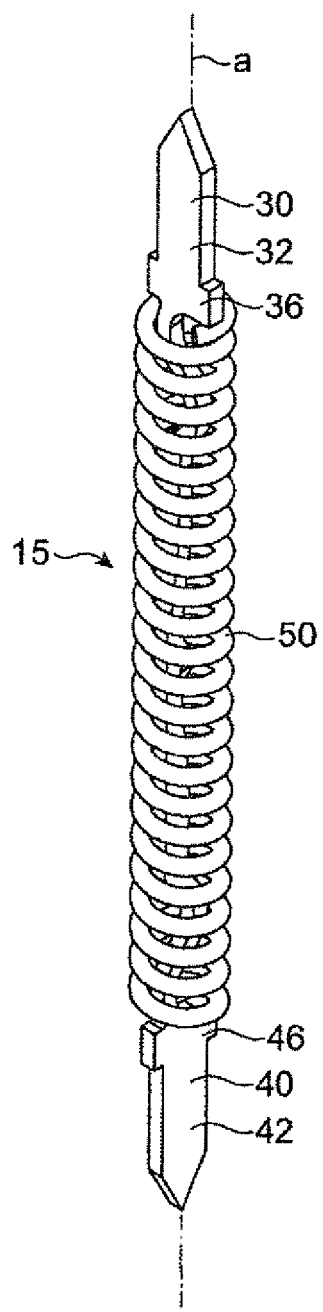
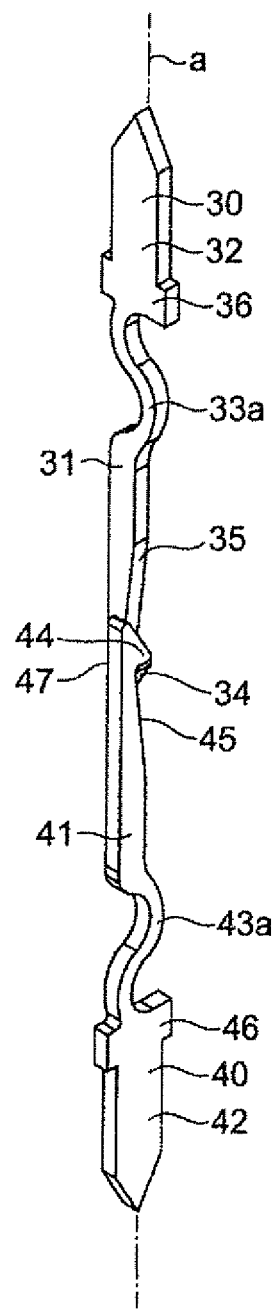
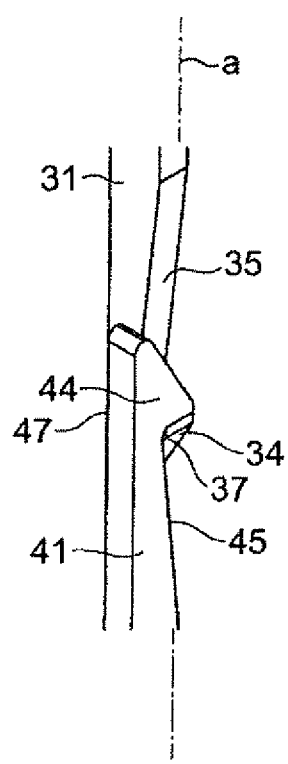
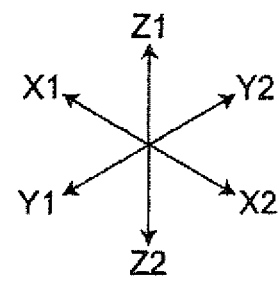

FIG. 14A
FIG. 14B
FIG. 14C
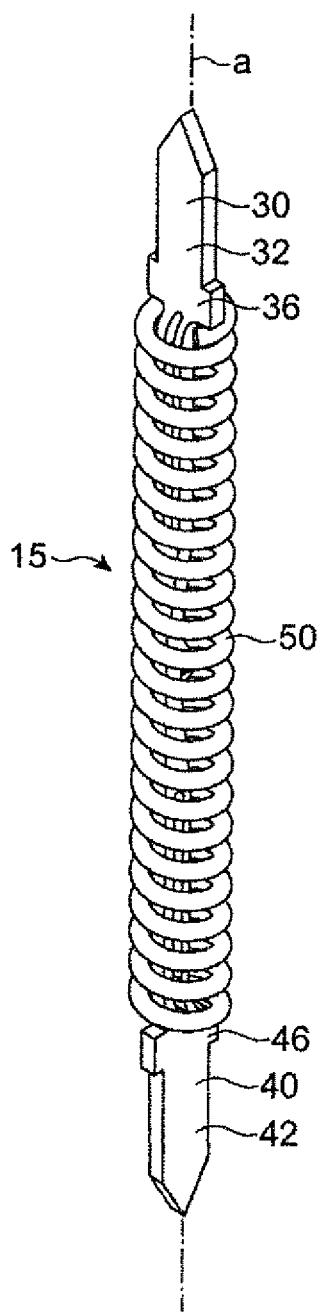
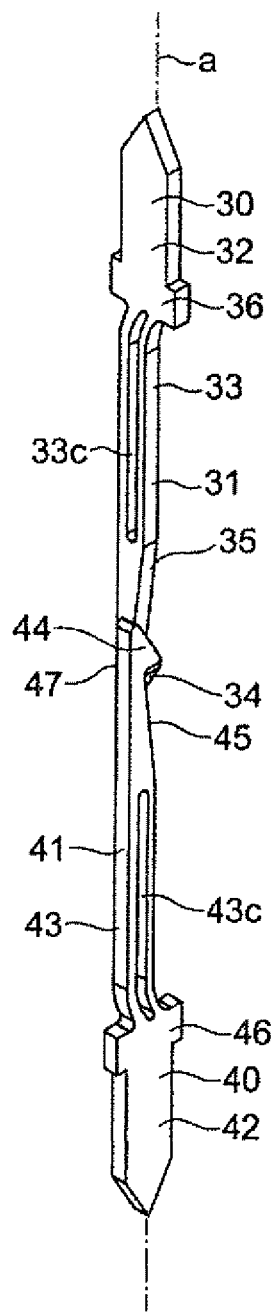
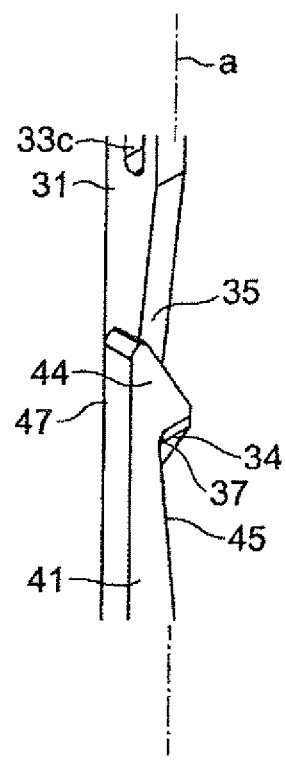
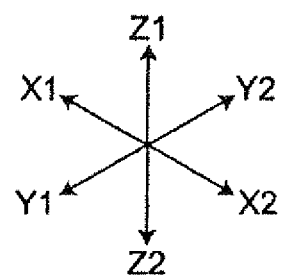

PROBE PIN AND INSPECTION DEVICE INCLUDING PROBE PIN

FIELD

The present invention relates to a probe pin and an inspection device including the probe pin.

BACKGROUND

An inspection device including a probe pin has been used to inspect the electric characteristics of a semiconductor integrated circuit such as an integrated circuit (IC) chip. The inspection device inspects the electrical conductivity of a test object by pressing multiple probe pins against the test object. An example of such probe pins included in the inspection device is described in Patent Literature 1.

The probe pin described in Patent Literature 1 includes a first plunger and a second plunger, which are semi-cylindrical and engageable with each other, and are contained in a conductive contact holder. Patent Literature 1 describes the first and second plungers that increase their area of contact as the plungers slide over each other in the axial direction of a spring member (refer to FIG. 1 in Patent Literature 1).

CITATION LIST

Patent Literature

Patent Literature 1: International Publication No. WO 2008/136396

SUMMARY

Technical Problem

However, the first and second plungers in the probe pin described in Patent Literature 1 simply slide over each other in the axial direction of the spring member without pressure, and thus may not achieve an intended contact pressure.

As semiconductor integrated circuits have become smaller, inspection devices are requested to inspect narrowly-spaced test portions in such semiconductor integrated circuits. In response to such requests, probe pins included in an inspection device are also to be smaller or thinner. However, the probe pin in Patent Literature 1 to be smaller or thinner can limit the possibility of increasing the contact area for increasing their contact reliability.

The probe pin described in Patent Literature 1 may not have high contact stability.

In response to the above issue, the present invention is directed to a small or thin probe pin having high contact stability, and an inspection device including the probe pin.

Solution to Problem

In response to the above aspect, a probe pin according to one aspect of the present invention includes an elastic hollow cylinder that expands and contracts along a central axis, a conductive first plunger extending in the elastic hollow cylinder along the central axis from a first end of the elastic hollow cylinder, and a conductive second plunger extending in the elastic hollow cylinder along the central axis from a second end of the elastic hollow cylinder. The first plunger and the second plunger are coupled together in the elastic hollow cylinder in a manner movable relative to each other along the central axis. The first plunger includes a first plunger body located in the elastic hollow cylinder, and a first terminal connected to the first plunger body and located outside the elastic hollow cylinder. The second plunger includes a second plunger body located in the elastic hollow cylinder, and a second terminal connected to the second plunger body and located outside the elastic hollow cylinder. The first plunger body includes a slope that tapers in a direction from an outer side toward an inner side of the elastic hollow cylinder, comes in contact with the second plunger body inside the elastic hollow cylinder, and is urged in a direction crossing the central axis by relative movement of the first plunger and the second plunger, and an elastic portion that is located between the first terminal and the slope and is elastically deformable.

An inspection device according to another aspect of the present invention includes a housing, and the probe pin contained in the housing.

Advantageous Effects

The probe pin according to the above aspects includes the slope that is urged in the direction crossing the central axis by relative movement between the first and second plungers, and the elastic portion located between a first holding portion and the slope to increase the contact pressure of the first plunger on the second plunger. The probe pin can thus have high contact stability.

The first and second plungers have a simple structure. The first plunger can thus be designed freely to have intended dimensions including width and length for easily achieving a probe that is smaller and thinner.

The inspection device according to the above aspects including the above probe pin can be smaller or thinner to have high contact stability, and can inspect narrowly-spaced test portions in a semiconductor integrated circuit.

BRIEF DESCRIPTION OF THE DRAWINGS

FIG. 4A is a perspective view of a probe pin according to a second embodiment of the present invention, FIG. 4B is a perspective view of the probe pin according to the second embodiment shown in FIG. 4A from which a coil spring is eliminated, and FIG. 4C is a partially enlarged perspective view of a first plunger body of a first plunger and a second plunger body of a second plunger shown in FIG. 4B that are engaged with each other.

FIG. 6A is a perspective view of a probe pin according to a third embodiment of the present invention, FIG. 6B is a perspective view of the probe pin according to the third embodiment shown in FIG. 6A from which a coil spring is eliminated, and FIG. 6C is a partially enlarged perspective view of a first engagement portion of a first plunger and a second engagement portion of a second plunger shown in FIG. 6B that are engaged with each other.

FIG. 8A is a perspective view of a probe pin according to a fourth embodiment of the present invention, FIG. 8B is a perspective view of the probe pin according to the fourth embodiment shown in FIG. 8A from which a coil spring is eliminated, and FIG. 8C is a partially enlarged perspective view of a first engagement portion of a first plunger and a second engagement portion of a second plunger shown in FIG. 8B that are engaged with each other.

FIG. 10A is a perspective view of a probe pin according to a fifth embodiment of the present invention, FIG. 10B is a perspective view of the probe pin according to the fifth embodiment shown in FIG. 10A from which a coil spring is eliminated, and FIG. 10C is a partially enlarged perspective view of a first engagement portion of a first plunger and a second engagement portion of a second plunger shown in FIG. 10B that are engaged with each other.

FIG. 123 is a perspective view of the probe pin according to the sixth embodiment shown in FIG. 12A from which a coil spring is eliminated.

FIG. 14A is a perspective view of a probe pin according to a seventh embodiment of the present invention, FIG. 143 is a perspective view of the probe pin according to the seventh embodiment shown in FIG. 14A from which a coil spring is eliminated, and FIG. 14C is a partially enlarged perspective view of a first engagement portion of a first plunger and a second engagement portion of a second plunger shown in FIG. 143 that are engaged with each other.

DETAILED DESCRIPTION

In describing the components in one or more embodiments of the present invention, the directional terms including X, Y, and Z directions and other terms indicating directions are used for easy understanding of the embodiments with reference to the drawings. These terms neither may indicate the directions in actual use of the embodiments of the present invention nor may limit the technical scope of the invention described in the claims.

First Embodiment

Figure 1:
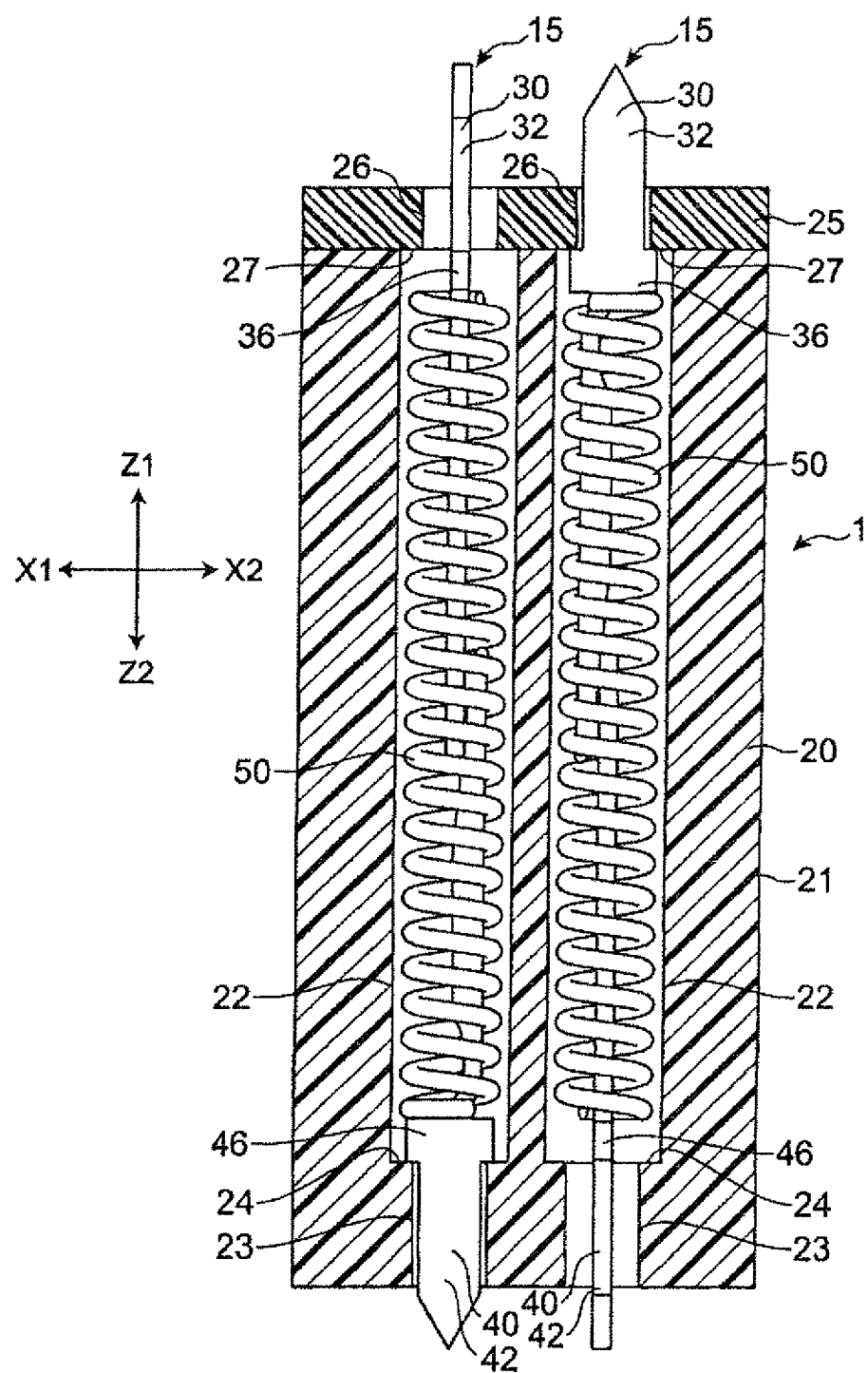
FIG. 1 is a cross-sectional view of an inspection device including probe pins according to a first embodiment of the present invention.

As shown in FIG. 1, probe pins 15 according to a first embodiment of the present invention are contained in, for example, a housing 20 when used. The probe pins 15 and the housing 20 together form an inspection device 10. The inspection device 10 contains, for example, two probe pins 15.

The inspection device 10 according to the present embodiment inspects, for example, the electric characteristics of semiconductor integrated circuits such as IC chips with high inspection accuracy.

The housing 20 includes a base 21 and a cover 25 attached to the base 21, which hold the probe pins 15.

As shown in FIG. 1, the base 21 includes two storage spaces each including a storage hole 22 and a first terminal opening 23 communicating with the storage hole 22. The storage holes 22 and the first terminal openings 23 extend parallel to each other in Z1- and Z2-directions of the base 21. More specifically, the storage spaces extend through the base 21 in Z1- and Z2-directions. The storage holes 22 and the first terminal openings 23 each have a substantially circular cross-section (section taken in X1- and X2-directions). In the cross-section, the storage hole 22 has a larger diameter than the first terminal opening 23. The storage hole 22 has a diameter large enough to hold a first holding portion 36 of the probe pin 15 as described below. The probe pin 15 contained in each storage hole 22 has a second terminal 42 described below, which protrudes outside the housing 20 through the first terminal opening 23. Each storage hole 22 has a larger diameter than the corresponding first terminal opening 23, thus defining an annular stepped portion at an opening edge 24 of the first terminal opening 23. When the probe pin 15 is inserted into the storage space, the annular stepped portion is placed into contact with a second holding portion 46 of the probe pin 15 (described below), to hold the probe pin 15 together with an annular stepped portion at an opening edge 27 of a second terminal opening 26 (described below). The base 21 is, for example, formed from a molded heat-resistant resin.

As shown in FIG. 1, the cover 25 is formed from a molded flat resin plate for covering the surface of the base 21 in Z1-direction. The cover 25 has second terminal openings 26 at predetermined positions, or at two positions at which the second terminal openings 26 communicate with the storage holes 22 when the cover 25 is attached to the base 21. Each second terminal opening 26 has a substantially circular cross-section and has a smaller diameter than the corresponding storage hole 22 in the base 21. When each probe pin 15 is contained in the storage hole 22 in the base 21 and the cover 25 is attached to the base 21, a first terminal 32 of the probe pin 15 (described below) protrudes outside the housing 20 through the corresponding second terminal opening 26. Each storage hole 22 has a larger diameter than the corresponding second terminal opening 26, thus defining the annular stepped portion at the opening edge 27 of the second terminal opening 26. When one probe pin 15 is inserted into the corresponding storage space, this annular stepped portion is placed into contact with the first holding portion 36 of the probe pin 15 (described below) to hold the probe pin 15 together with the annular stepped portion at the opening edge 24 of the corresponding first terminal opening 23.

Figure 2A:
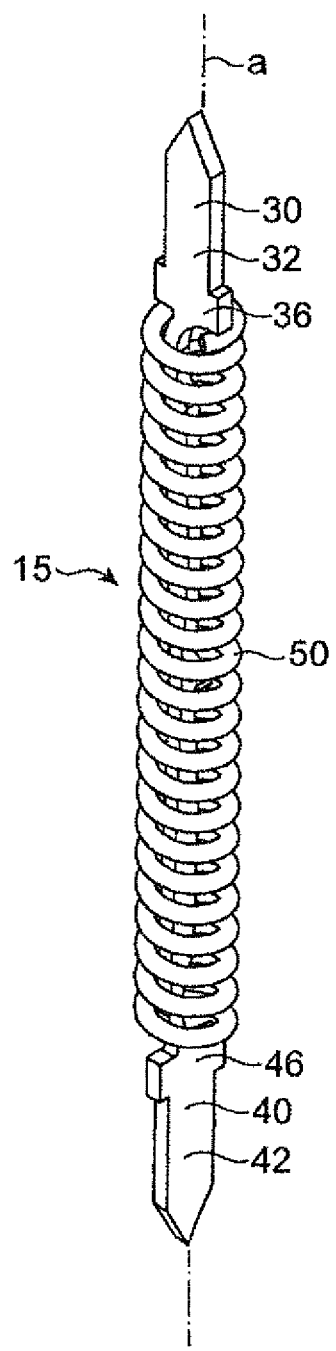
FIG. 2A is a perspective view of a probe pin according to the first embodiment of the present invention.
Figure 2B:
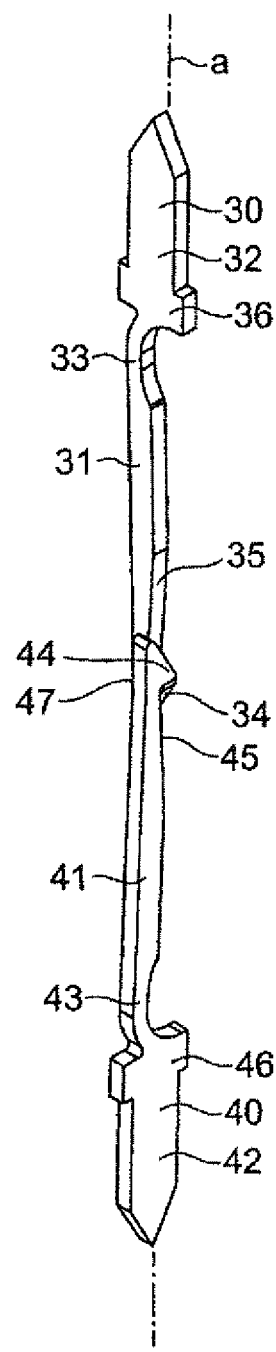
FIG. 2B is a perspective view of the probe pin according to the first embodiment shown in FIG. 2A from which a coil spring is eliminated.
Figure 2C:
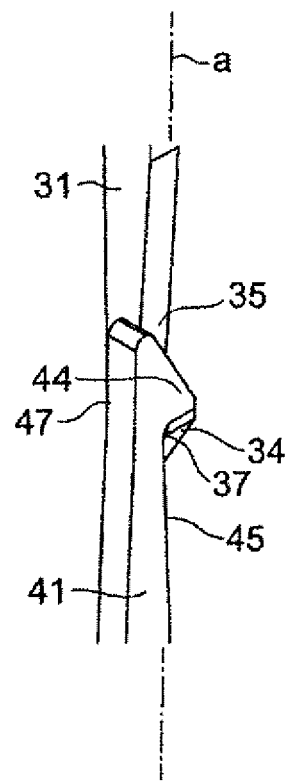
FIG. 2C is a partially enlarged perspective view of a first engagement portion of a first plunger and a second engagement portion of a second plunger shown in FIG. 2B that are engaged with each other.
Figure 2C:
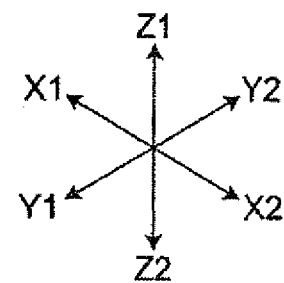
Figure 3:
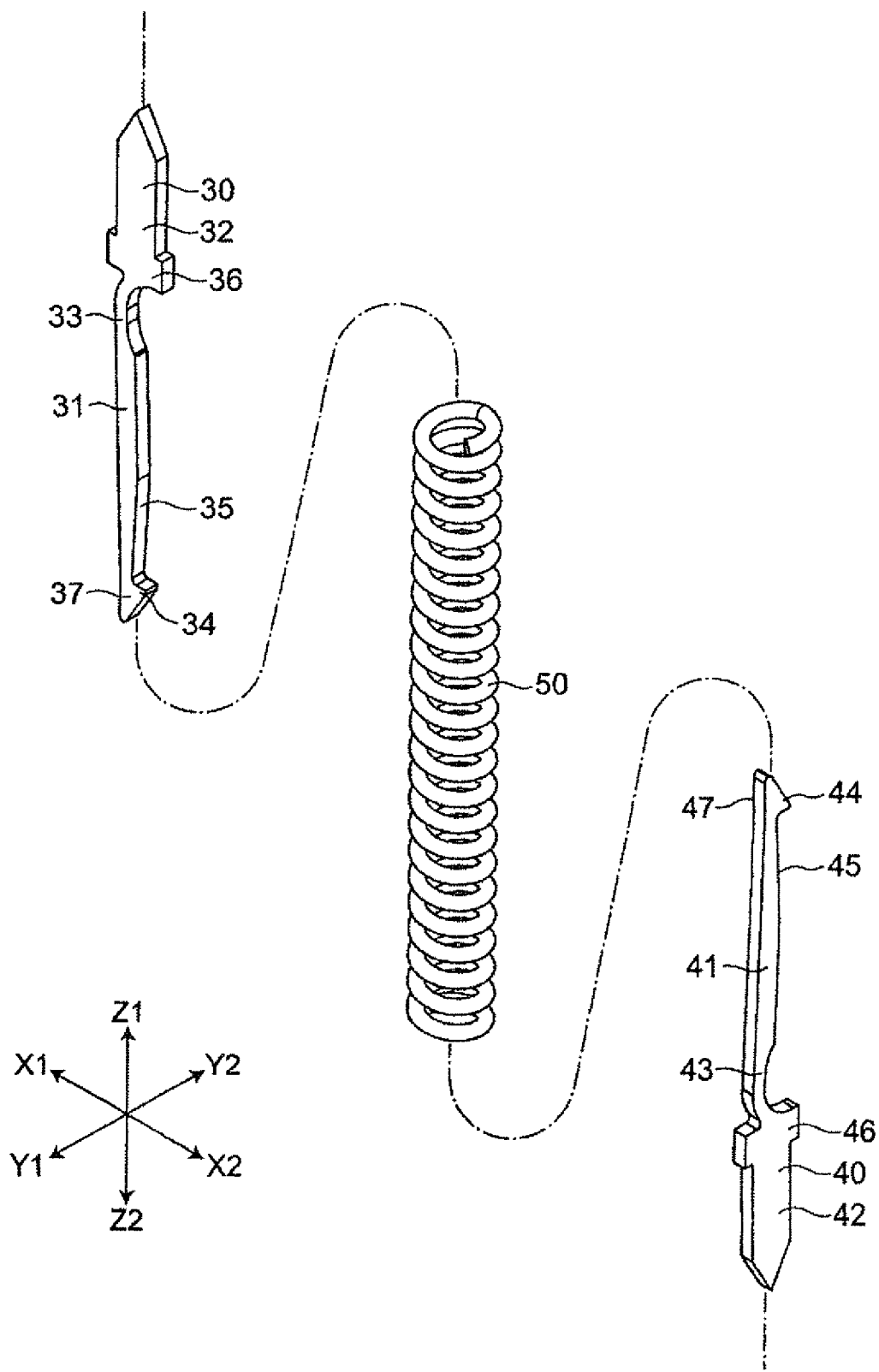
FIG. 3 is an exploded perspective view of the probe pin shown in FIG. 2A.

As shown in FIGS. 2A to 3, each probe pin 15 according to the present embodiment includes a first plunger 30, a second plunger 40, and a coil spring 50, which is an example of an elastic hollow cylinder. The first plunger 30 extends inside the coil spring 50 (specifically through the interior space of the elastic hollow cylinder) from a first end of the coil spring 50 (upper end in FIG. 2A) along a central axis a of the coil spring 50 (in Z1- and Z2-directions). The second plunger 40 extends inside the coil spring 50 (specifically through the interior space of the elastic hollow cylinder) from a second end of the coil spring 50 (lower end in FIG. 2A) along the central axis a of the coil spring 50. The first and second plungers 30 and 40 of each probe pin 15 are inserted into the coil spring 50 through both ends along the central axis a of the coil spring 50, and are coupled (engaged) together in a manner movable relative to each other in the coil spring 50 along the central axis a of the coil spring 50.

The first plunger 30 is a conductive metal plate having a rectangular cross-section. As shown in FIG. 3, the first plunger 30 includes a first plunger body 31, a first terminal 32, and a pair of first holding portions 36. The first plunger body 31 is contained in the coil spring 50. The first terminal 32 extends in Z1-direction from the upper end of the first plunger body 31 outside the coil spring 50, and has a pointed tip. The pair of first holding portions 36 protrudes in X1- and X2-directions in a portion where the first plunger body 31 meets the first terminal 32. More specifically, a portion including the first holding portions 36 and the first terminal 32 has a greater width (dimension in X1- and X2-directions) than the first terminal 32. The first plunger 30 has a uniform thickness (dimension in Y1- and Y2-directions).

As shown in FIG. 3, the first plunger body 31 is substantially linear, and protrudes in Z2-direction from substantially the middle of the first terminal 32. The first plunger body 31 includes a first elastic portion 33, a first slope 35, a first engagement portion 34, and a first contact surface 37.

The first elastic portion 33 forms the base of the first plunger body 31, which is the base from which the first plunger body 31 protrudes. The first elastic portion 33 is bent to curve out (protrude) in X1-direction from substantially the middle of the first terminal 32. The first elastic portion 33 has surfaces facing in Y1- and Y2-directions, which have a smaller width in X1- and X2-directions than the other portions of the first plunger body 31. The first elastic portion 33 is elastically deformable in the width direction (X1- and X2-directions). More specifically, the first elastic portion 33 is resilient (elastic) and is elastically deformable in the width direction. The first elastic portion 33 is located between the first terminal 32 and the first slope 35. The first slope 35 is on the surface of the first plunger body 31 facing in X2-direction near the free end, or specifically at a portion near the distal end of the first plunger body 31. The first slope 35 is inclined to allow the first plunger body 31 to taper toward the free end. The first slope 35 is inclined to allow the first plunger body 31 to taper toward the inside of the coil spring 50 away from the outside of the coil spring 50. The first slope 35 is located in the coil spring 50 while being allowed to come in contact with a second plunger body 41 of the second plunger 40 (described below). The first slope 35 is urged in the direction crossing the central axis a of the coil spring 50 by relative movement of the first and second plungers 30 and 40. The first engagement portion 34 protrudes in X2-direction from the surface of the first slope 35 facing in X2-direction at the free end of the first slope 35, and is substantially triangular. As shown in FIG. 3, the first contact surface 37 is on the surface of the first engagement portion 34 facing in Y1-direction.

The entire first plunger body 31 is substantially linear from the first elastic portion 33 to the free end, but may be inclined in X2-direction. A portion where the first slope 35 meets the first engagement portion 34 may be displaced from at least the central axis a in X2-direction. The first terminal and the first plunger body 31 having the above portions are formed integrally.

As shown in FIG. 3, the second plunger 40 has the same shape as the first plunger 30. More specifically, the second plunger 40 includes a second plunger body 41, a second terminal 42, and second holding portions 46. The second plunger body 41 includes a second elastic portion 43, a second slope 45, a second engagement portion 44, and a second contact surface 47. The description of the first plunger 30 applies to the second plunger 40.

As shown in FIG. 2C, the first engagement portion 34 of the first plunger 30 and the second engagement portion 44 of the second plunger 40 are engaged with each other in the coil spring 50 while respectively protruding in the directions (X2- and Y2-directions) crossing (substantially perpendicularly) each other (specifically, X1- and X2-directions are the thickness direction of the second plunger 40, and Y1- and Y2-directions are the width direction of the second plunger 40). The first and second plunger bodies 31 and 41 come into contact or pressure contact with each other between the first slope 35 and the second contact surface 47 and between the second slope 45 and the first contact surface 37.

The coil spring 50 is formed from an elastic metal wire. As shown in FIG. 3, the coil spring 50 is helically wound. The coil spring 50 has an inner diameter that is smaller than the width of the first holding portions 36 of the first plunger 30 and with which the coil spring 50 can receive the first and second plunger bodies 31 and 41 of the first and second plungers 30 and 40. The coil spring 50 has a uniform diameter and is wound at a uniform pitch. The coil spring 50 may have its spring length adjusted to be compressed when the first and second plungers 30 and 40 are coupled together in the coil spring 50 and to exert its urging force on the first and second plungers 30 and 40.

The first and second plungers 30 and 40 are both conductive. The first and second plungers 30 and 40 may be each punched out from a single plate or formed by electroforming. As appropriate, the first and second plungers 30 and 40 may each be formed from a non-conductive material with its surface plated with metal, coated with a conductive material, or processed with another surface treatment.

The coil spring 50 may be any elastic hollow cylinder, including a non-conductive elastic hollow cylinder. For example, the coil spring 50 may be a resin hollow cylindrical spring or a non-conductive hollow cylindrical elastic member with its surface plated with metal, coated with a conductive material, or processed with another surface treatment, or may be a rubber tube.

A method for assembling the probe pin 15 will now be described with reference to FIG. 3.

As shown in FIG. 3, the first plunger body 31 of the first plunger 30 is first inserted into a first end of the coil spring 50 along the central axis a until the first holding portions 36 come into contact with the first end of the coil spring 50.

The second plunger body 41 of the second plunger 40 is inserted into a second end of the coil spring 50 along the central axis a. During insertion, the first slope 35 of the first plunger body 31 and the second contact surface 47 of the second plunger body 41 are adjusted to come in contact with each other, and the first contact surface 37 of the first plunger body 31 and the second slope 45 of the second plunger body 41 are adjusted to come in contact with each other.

More specifically, during insertion, the first slope 35 of the first plunger 30 is adjusted to be perpendicular to the surface of the second plunger body 41 including the second engagement portion 44 (surface facing in Y2-direction).

As shown in FIG. 2C, the first engagement portion 34 of the first plunger 30 and the second engagement portion 44 of the second plunger 40 are engaged with each other in the coil spring 50 while protruding in the directions substantially perpendicular to each other.

This integrates the first and second plungers 30 and 40, which are then movable relative to each other while sliding over each other along the central axis a of the coil spring 50. The first slope 35 is pressed against the second plunger body 41 at the second contact surface 47, and thus the first elastic portion 33 of the first plunger 30 is elastically deformed in a direction (X1-direction) crossing the central axis a of the coil spring 50. The second slope 45 is pressed against the first plunger body 31 at the first contact surface 37, and thus the second elastic portion 43 of the second plunger 40 is elastically deformed in a direction (Y1-direction) crossing the central axis a of the coil spring 50.

In this case, the first and second plungers 30 and 40 are maintained in a stable manner as they are electrically connected together, with the first slope 35 in pressure contact with the second contact surface 47 and the second slope 45 in pressure contact with the first contact surface 37.

In the probe pin 15, the first slope 35, which is urged in the direction crossing the central axis a of the coil spring 50 by relative movement of the first and second plungers 30 and 40, and the first elastic portion 33, which is located between the first holding portions 36 and the first slope 35, increase the contact pressure of the first plunger 30 on the second plunger 40. Similarly, the second slope 45 and the second elastic portion 43 increase the contact pressure of the second plunger 40 on the first plunger 30. The probe pin 15 thus has high contact stability.

The first and second plungers 30 and 40 have a simple structure, and thus can be designed freely to have intended dimensions including width and length for easily achieving the probe pin 15 that is smaller and thinner.

When the first and second engagement portions 34 and 44 are engaged with each other, the first and second plunger bodies 31 and 41 come into contact with each other on their two surfaces adjacent to each other. The first and second plungers 30 and 40 are thus less likely to separate from each other, and are in contact with each other across a wide contact area, thus improving the contact reliability.

The elastic portion 33 of the first plunger body 31 is bent to curve out in the direction perpendicular to the central axis a of the coil spring 50. This structure allows the elastic portion 33 to include a material having a small elastic force, which is selectable from a wider variety of materials.

The first plunger 30 includes the first holding portion 36, and the second plunger 40 includes the second holding portion 46. These portions may prevent the coil spring 50 from coming off, and ease the handling of the probe pin 15 in the assembly process. This increases the production efficiency of the probe pin 15.

The first and second plungers 30 and 40 have the same shape, and are thus easily manufactured at lower costs.

As described above, the probe pin 15 may have the coil spring 50 compressed at an initial state (engaged state). More specifically, the coil spring 50 having a restoring force may urge the first holding portions 36 of the first plunger 30 and the second holding portions 46 of the second plunger 40 in Z1- and Z2-directions with both ends of the coil spring 50. This structure eases the handling of the probe pin 15 in the assembly process.

A method for manufacturing the inspection device 10 will now be described with reference to FIG. 1.

First, two probe pins 15 assembled as described above are inserted into the two storage holes 22 in the base 21.

More specifically, the second terminal 42 of the second plunger 40 of each probe pin 15 is inserted into the corresponding storage hole 22 in the base 21, until the second holding portions 46 abut against the annular stepped portion at the opening edge 24 of the first terminal opening 23. The coil spring 50 is also contained in the storage hole 22. As shown in FIG. 1, the base 21 has a bottom having a thickness with which the tip of the second terminal 42 protrudes beyond the undersurface of the base 21.

Then, the cover 25 is laid on the surface of the base 21 in Z1-direction. The first terminals 32 of the probe pins 15 are inserted into the two second terminal openings 26 of the cover 25, until the first holding portions 36 abut against the opening edges 27 of the second terminal openings 26. Thus, each probe pin 15 is held by the annular stepped portion at the opening edge 24 of the first terminal opening 23 and the annular stepped portion at the opening edge 27 of the second terminal opening 26. Each storage hole 22 in the base 21 communicates with the corresponding second terminal opening 26 of the cover 25. The base 21 and the cover 25 are fastened together by a known fastening method (not shown). Thus, the two probe pins 15 are supported in the housing 20 in a manner movable in Z1- and Z2-directions. As shown in FIG. 1, the cover 25 has a thickness with which the tip of each first terminal 32 protrudes beyond the surface of the cover 25 facing in Z1-direction.

A method for using the inspection device 10 will now be described with reference to FIG. 1.

First, a circuit board (not shown) is placed at a position in Z2-direction of the inspection device 10 assembled as described above. An IC chip, which is a test object (not shown), is placed at a position in Z1-direction. The circuit board has its conductive portion located below the tips of the second terminals 42 of the second plungers 40. The IC chip has its test surface located above the tips of the first terminals 32 of the first plungers 30.

Subsequently, the circuit board moves in Z1-direction, and the IC chip moves in Z2-direction to hold the inspection device 10 between them. The conductive portion of the circuit board comes into contact with the tips of the second terminals 42, and the test surface of the IC chip comes into contact with the tips of the first terminals 32. When the circuit board and the IC chip further move, the tips of the first terminals 32 and the tips of the second terminals 42 are retracted into the housing 20, and each first plunger 30 and the corresponding second plunger 40 slide over each other. In this state, each first engagement portion 34 and the corresponding second engagement portion 44 become disengaged from each other. As shown in FIG. 3, the second contact surface 47 of each second plunger 40 slides over the first slope 35 of the corresponding first plunger 30 in Z1-direction. Similarly, the first contact surface 37 of each first plunger 30 slides over the second slope 45 of the corresponding second plunger 40 in Z2-direction.

The first slope 35 is inclined to widen toward the first engagement portion 34 of the first plunger body 31 (the first plunger body 31 tapers in Z2-direction). As the second contact surface 47 slides in Z1-direction (that is, as the first and second plungers 30 and 40 approach each other), the contact pressure between the first slope 35 and the second contact surface 47 increases. Similarly, as the first contact surface 37 slides in Z2-direction, the contact pressure between the second slope 45 and the first contact surface 37 increases.

The first elastic portion 33 of the first plunger body 31 and the second elastic portion 43 of the second plunger body 41 are elastically deformed as the first and second plungers 30 and 40 slide, and the first elastic portion 33 and second elastic portion 43 keep the contact pressure with their elastic force. In other words, the inspection device 10 including the probe pins 15 can have high contact stability.

This structure electrically connects the conductive portion of the circuit board to the test portion of the IC chip with the two probe pins 15, and feeds a current through the IC chip.

Thus, the inspection device can inspect for proper conduction through the internal circuit of each IC chip and determine whether each IC chip is defective. In addition, the probe pins 15 can have a smaller size or a smaller thickness than existing probe pins. The inspection device having this structure can thus inspect narrowly-spaced test portions in the semiconductor integrated circuit.

Second Embodiment

Figure 5:
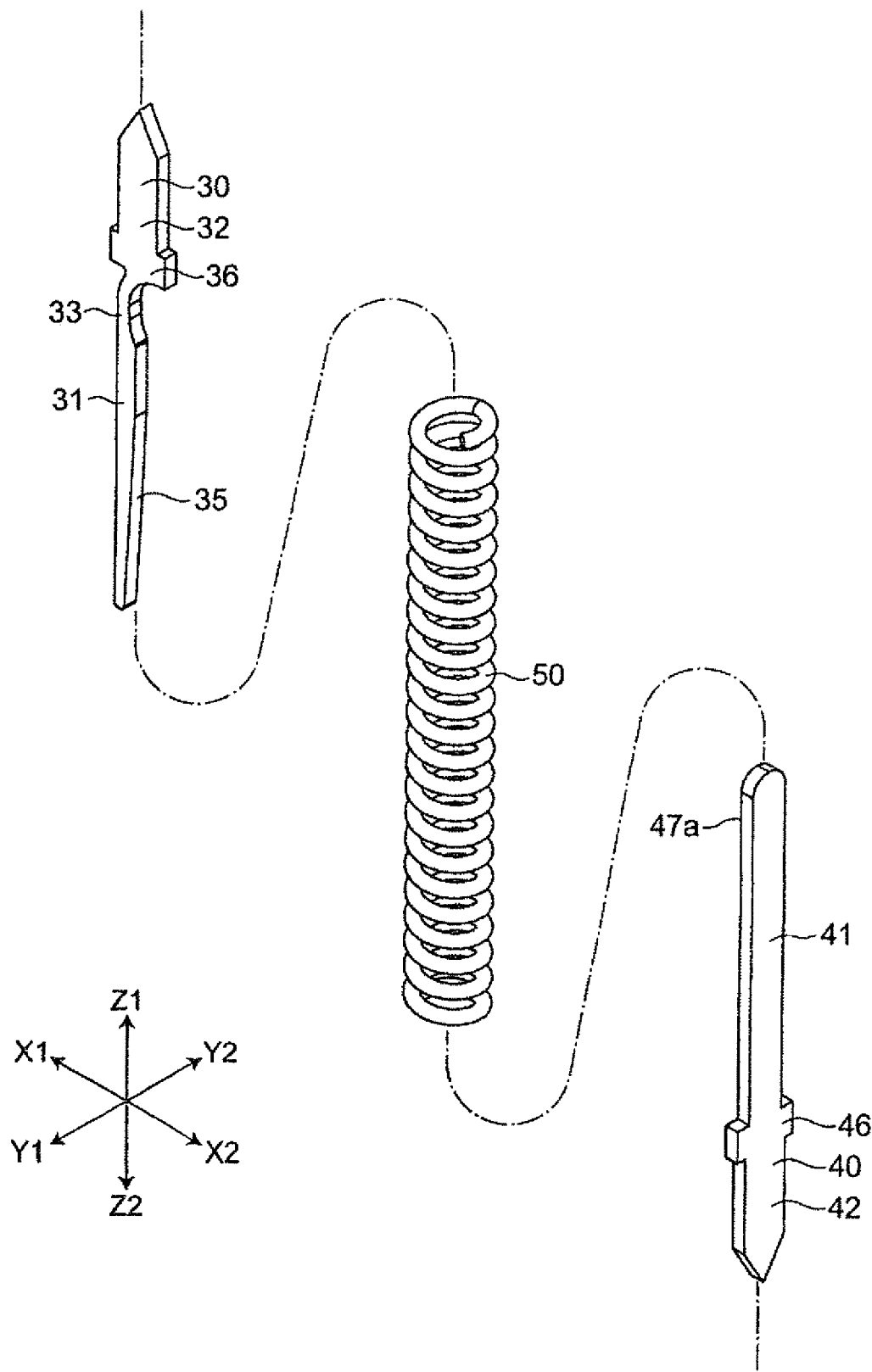
FIG. 5 is an exploded perspective view of the probe pin shown in FIG. 4A.

FIGS. 4A to 5 show the probe pin 15 according to the second embodiment of the present invention. The second embodiment differs from the first embodiment in that the first and second plungers 30 and 40 do not include the first and second engagement portions 34 and 44 at their free ends (the distal end of the first plunger body 31 opposite to the first terminal 32 and the distal end of the second plunger body 41 opposite to the second terminal 42). The second embodiment also differs from the first embodiment in that the second plunger body 41 does not include the second elastic portion 43 and the second slope 45. In the embodiment described below, the components that are the same as those in the first embodiment are given the same reference numerals and will not be described in detail.

More specifically, as shown in FIG. 5, the first plunger body 31 includes a first slope 35 that extends to allow the first plunger body 31 to taper toward the free end of the first plunger body 31. The second plunger body 41 is formed from a flat plate extending along the central axis a and having a rectangular cross-section. When the first and second plungers 30 and 40 are moved relative to each other, the first slope 35 of the first plunger 30 and a flat surface 47a of the second plunger body 41 slide over each other to elastically deform the first elastic portion 33.

This structure eliminates an engagement between the first and second plungers 30 and 40 in the coil spring 50, and thus eases the assembly and increases the production efficiency of the probe pin 15.

Third Embodiment

Figure 7:
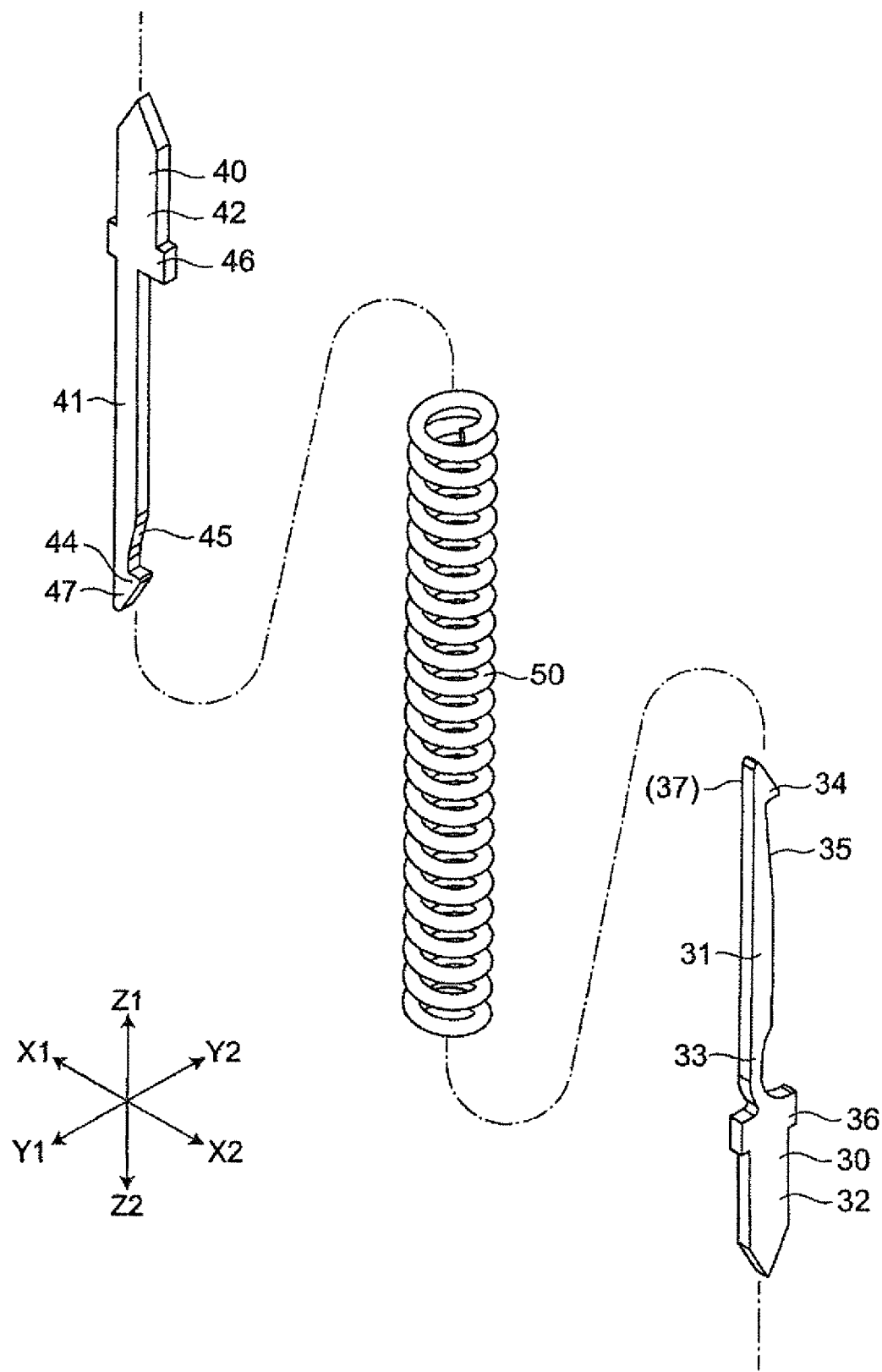
FIG. 7 is an exploded perspective view of the probe pin shown in FIG. 6A.

FIGS. 6A to 7 show a probe pin 15 according to a third embodiment of the present invention. For ease of explanation, the positional relationship between the first and second plungers 30 and 40 is reversed in the figures in the third embodiment.

The third embodiment differs from the first embodiment in that the second plunger body 41 of the second plunger 40 does not include the second elastic portion. The third embodiment also differs from the first embodiment in that the linear second plunger body 41 extends in Z2-direction from the position displaced from the central axis a in X1-direction, instead of extending from the middle of the portion including the second holding portions 46 and the second terminal 42. The second plunger 40 is a rigid body.

This structure simplifies the shape of the second plunger 40 and eases the manufacture of the second plunger 40 with a method other than electroforming.

Fourth Embodiment

Figure 9:
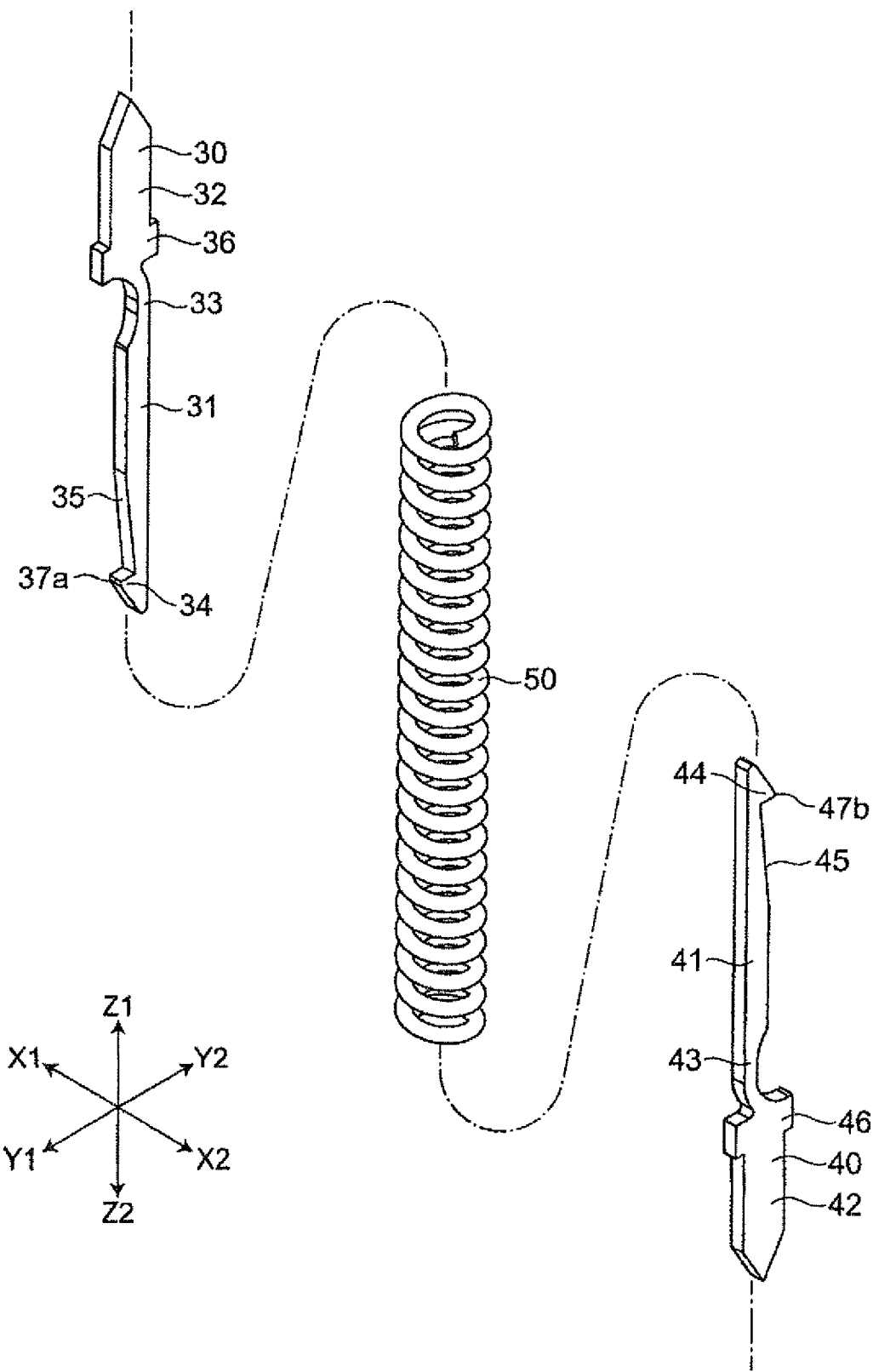
FIG. 9 is an exploded perspective view of the probe pin shown in FIG. 8A.

FIGS. 8A to 9 show a probe pin 15 according to a fourth embodiment of the present invention. The fourth embodiment differs from the first embodiment in that the first engagement portion 34 at the first slope 35 of the first plunger body 31 faces the second slope 45 at which the second engagement portion 44 of the second plunger body 41 is arranged. In the present embodiment, the first slope 35 comes into pressure contact (or into contact) with a second end surface 47b of the second engagement portion 44, and the second slope 45 comes into pressure contact (or into contact) with a first end surface 37b of the first engagement portion 34.

The first engagement portion 34 and the second engagement portion 44 are urged in opposite directions. Thus, the contact surfaces of the first and second plungers 30 and 40, between the first slope 35 and the second end surface 47b, and between the second slope 45 and the first end surface 37b, can receive a higher contact pressure under the spring force (elastic force) of the first and second elastic portions 33 and 43. Thus, the first and second plungers 30 and 40 can be maintained in contact with each other in a stable manner.

Fifth Embodiment

Figure 11:
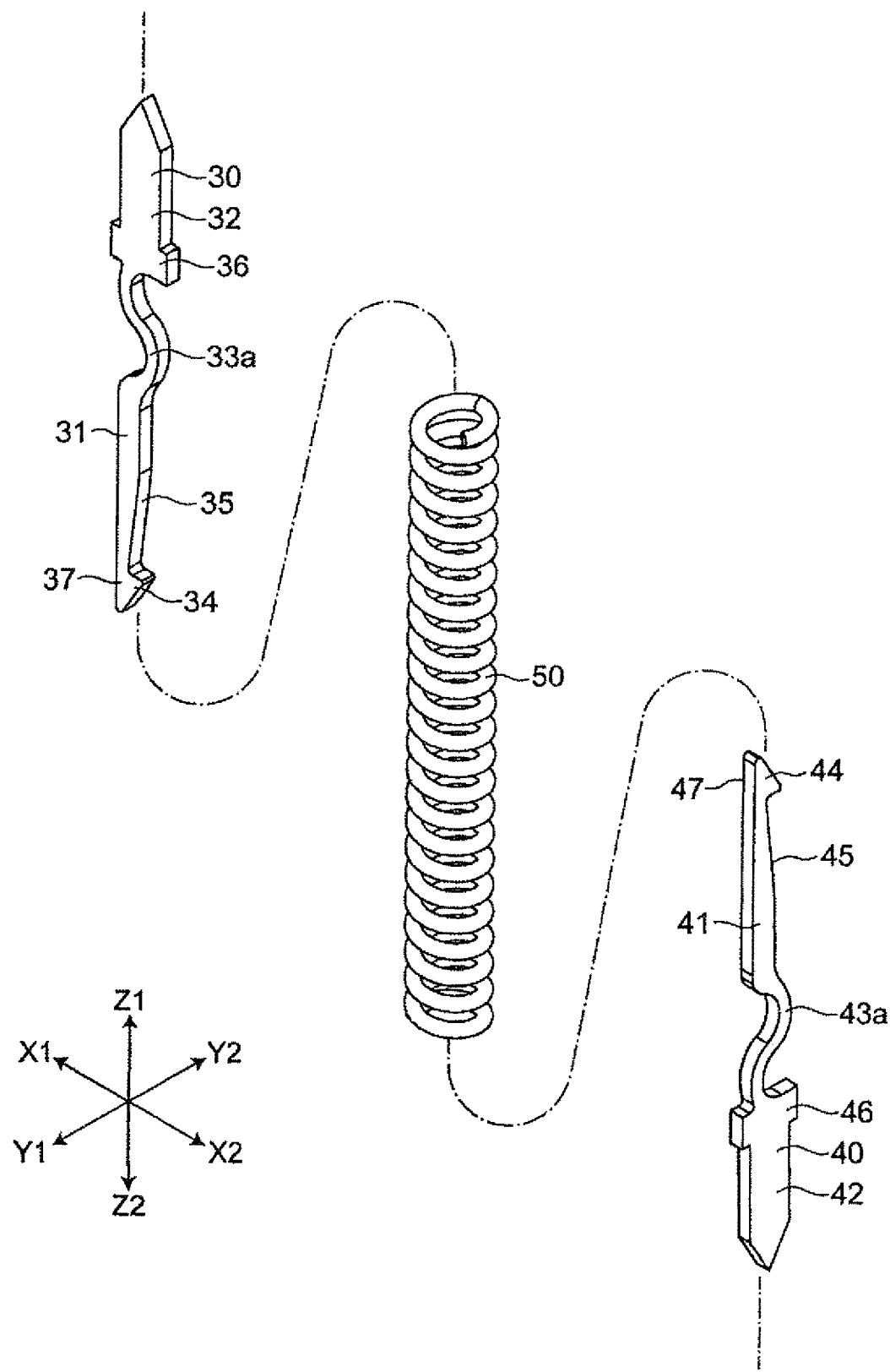
FIG. 11 is an exploded perspective view of the probe pin shown in FIG. 10A.

FIGS. 10A to 11 show a probe pin 15 according to a fifth embodiment of the present invention. The fifth embodiment differs from the first embodiment in that a first elastic portion 33a and a second elastic portion 43a have curves along the central axis a.

The probe pin 15 according to the fifth embodiment includes a first elastic portion 33a and a second elastic portion 43a having curves. This structure easily disperses stress applied on the elastic portions 33a and 43a and reduces stress concentration. The probe pin 15 can thus have a longer life.

Sixth Embodiment

Figure 12A:
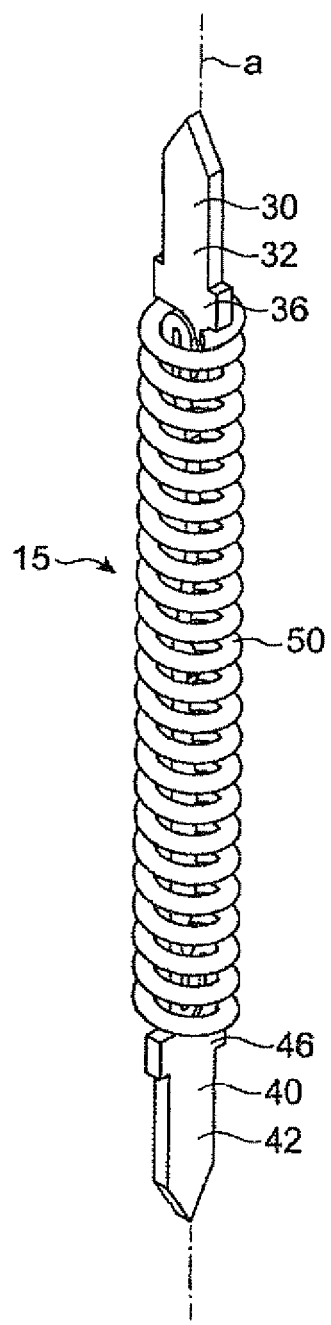
FIG. 12A is a perspective view of a probe pin according to a sixth embodiment of the present invention.
Figure 12B:
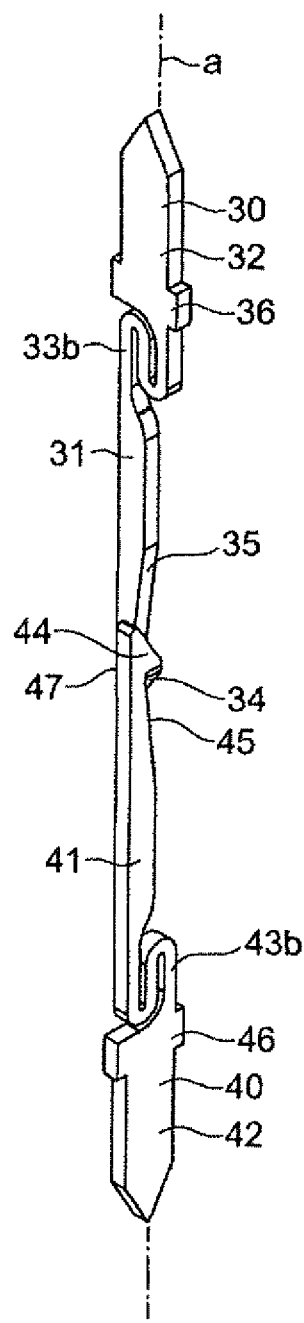
FIG. 12C is a partially enlarged perspective view of a first engagement portion of a first plunger and a second engagement portion of a second plunger shown in FIG. 123 that are engaged with each other.
Figure 12C:
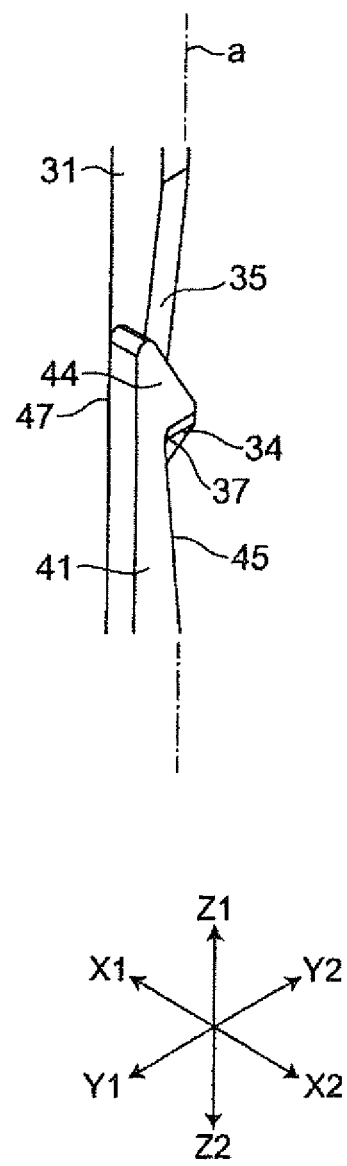
Figure 13:
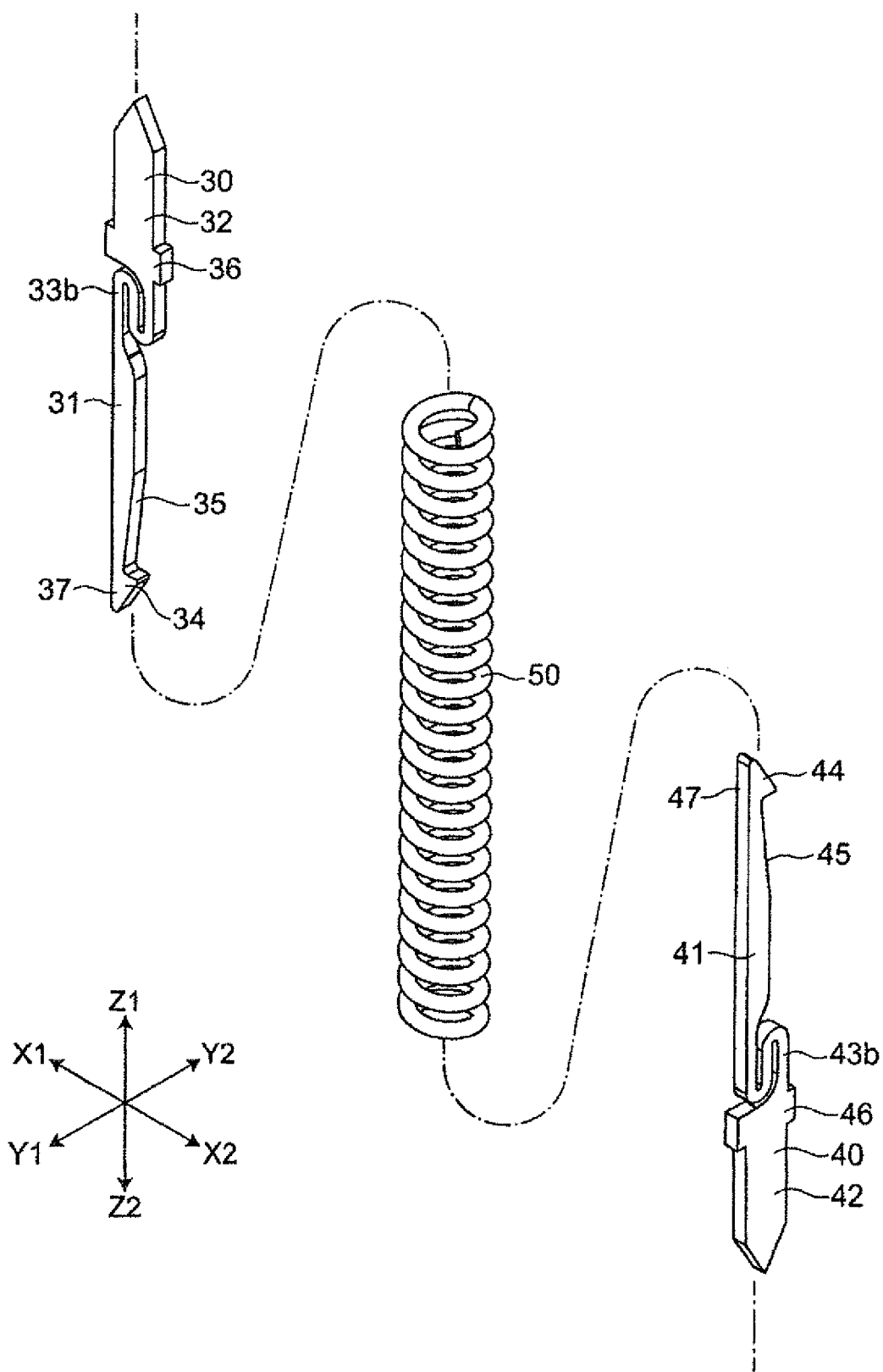
FIG. 13 is an exploded perspective view of the probe pin shown in FIG. 12A.

FIGS. 12A to 13 show a probe pin 15 according to a sixth embodiment of the present invention. The sixth embodiment differs from the first embodiment in that a first elastic portion 33b and a second elastic portion 43b have curves in the direction perpendicular to the central axis a.

The probe pin 15 according to the sixth embodiment includes the first elastic portion 33b and the second elastic portion 43b having curves. This structure easily disperses stress applied on the elastic portions 33b and 43b and reduces stress concentration. The probe pin 15 can thus have a longer life.

Seventh Embodiment

Figure 15:
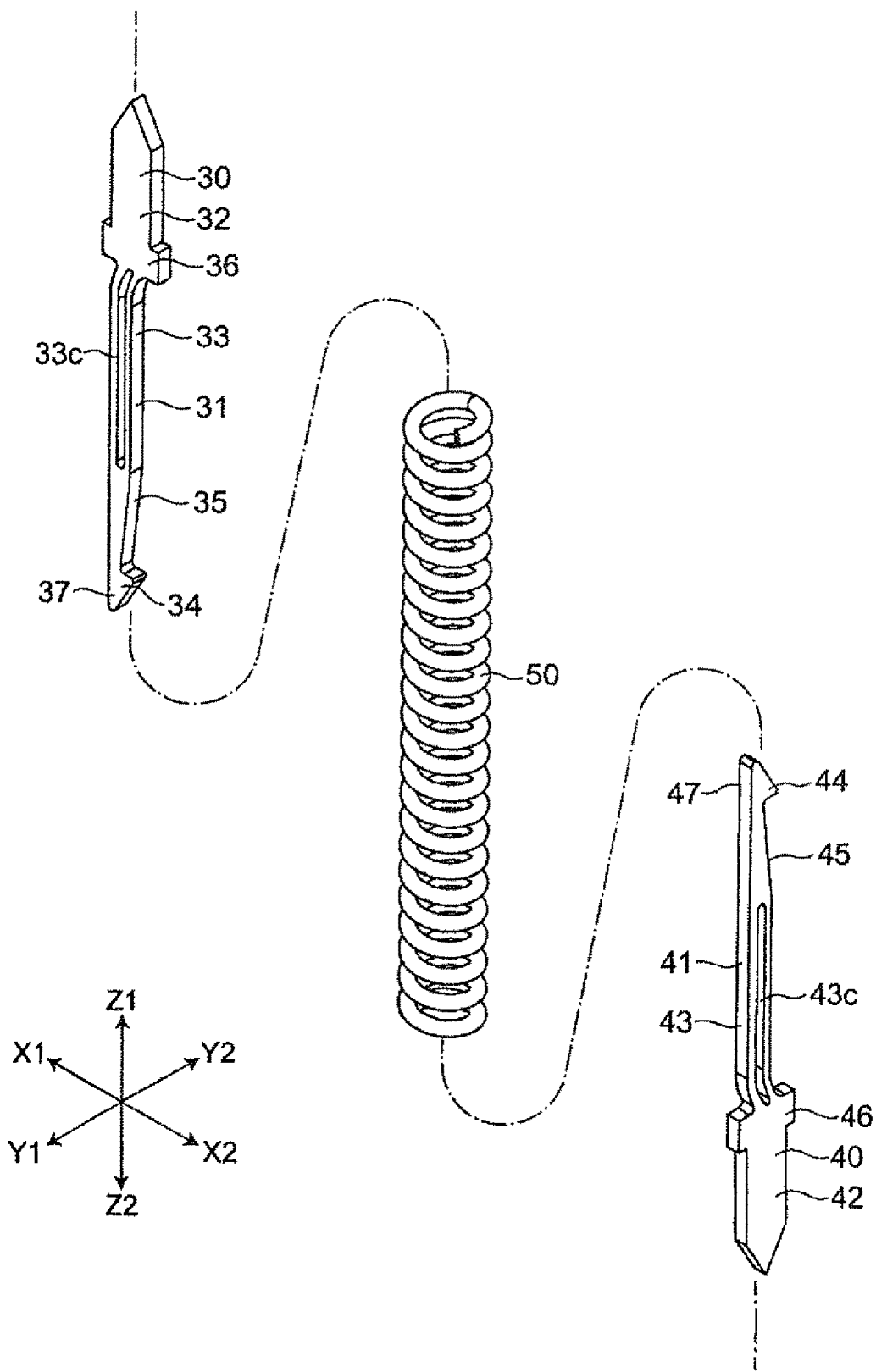
FIG. 15 is an exploded perspective view of the probe pin shown in FIG. 14A.

FIGS. 14A to 15 show a probe pin 15 according to a seventh embodiment of the present invention. The seventh embodiment differs from the first embodiment in that the first plunger body 31 includes a first slit 33c and the second plunger body 41 includes a second slit 43c. The first slit 33c and the second slit 43c extend along the central axis a.

In the probe pin 15 according to the present embodiment, the first plunger body 31 or the second plunger body 41 can have an appropriate elastic force by adjusting the length of the first slit 33c or the second slit 43c. Thus, the probe pin 15 can have an elastic force appropriate for an inspection device. The slit may not be included in each of the first and second plunger bodies 31 and 41 but may be included in either one of the first and second plunger bodies 31 and 41.

Although the probe pins 15 according to the first to seventh embodiments of the present invention have been described specifically, the present invention is not limited to the above embodiments and may be in various other forms within the scope without departing from the gist of the invention. For example, the present invention may be modified in the following forms, which also fall within the technical scope of the present invention.

The inspection device 10 may include one or more holding portions in the housing 20 to receive one or more probe pins 15.

The base 21 and the cover 25 may be detachable from each other. These structures allow a broken one of the probe pins 15 to be replaced by removing the cover 25 from the base 21.

The first plunger body 31 may not be substantially linear. For example, the first plunger body 31 may curve from its base to the free end. The first plunger body 31 may include an elastic portion in at least a portion of the first plunger body 31 to urge the second plunger 40. The first and second plunger bodies 31 and 41 may have a rectangular cross-section, or may have, for example, a square cross-section instead of a rectangular cross-section.

The first and second terminals 32 and 42 each may not have a pointed tip. The first and second terminals 32 and 42 may each have, for example, a wavy or semicircular tip, or a tip with a shape selected from various different shapes in accordance with the shape of a test portion of a test object.

The first and second plunger bodies 31 and 41 may have different lengths along the central axis a. One of the plungers may have a larger length to enlarge the elastic portion. This structure disperses stress applied on the elastic portion. The probe pin can thus have a longer life.

The test object may be, for example, an electronic component such as a CPU chip, instead of an IC chip.

Various embodiments of the present invention have been described in detail with reference to the drawings. Finally, various aspects of the present invention will now be described.

A probe pin according to a first aspect of the present invention includes an elastic hollow cylinder that expands and contracts along a central axis, a conductive first plunger inserted into a first end of the elastic hollow cylinder along the central axis, and a conductive second plunger inserted into a second end of the elastic hollow cylinder along the central axis. The first plunger and the second plunger are held in the elastic hollow cylinder in a manner slidable over each other along the central axis. The first plunger includes a first plunger body that extends along the central axis in the elastic hollow cylinder, a slope that is inclined to allow the first plunger body to taper toward a free end of the first plunger body, and an elastic portion that is elastically deformed when the second plunger slides over the slope.

In other words, the probe pin according to the first aspect includes an elastic hollow cylinder that expands and contracts along a central axis, a conductive first plunger extending in the elastic hollow cylinder along the central axis from a first end of the elastic hollow cylinder, and a conductive second plunger extending in the elastic hollow cylinder along the central axis from a second end of the elastic hollow cylinder. The first plunger and the second plunger are coupled together in the elastic hollow cylinder in a manner movable relative to each other along the central axis. The first plunger includes a first plunger body located in the elastic hollow cylinder, and a first terminal connected to the first plunger body and located outside the elastic hollow cylinder. The second plunger includes a second plunger body located in the elastic hollow cylinder, and a second terminal connected to the second plunger body and located outside the elastic hollow cylinder. The first plunger body includes a slope that tapers in a direction from an outer side toward an inner side of the elastic hollow cylinder, comes in contact with the second plunger body inside the elastic hollow cylinder, and is urged in a direction crossing the central axis by relative movement of the first plunger and the second plunger, and an elastic portion that is located between the first terminal and the slope and is elastically deformable.

In the probe pin according to the first aspect, the elastic portion is elastically deformed when the second plunger slides over the slope of the first plunger, and the restoring force resulting from the elastic deformation increases the contact pressure between the first and second plungers, and improves the contact stability. More specifically, the slope, which is urged in the direction crossing the central axis by relative movement of the first and second plungers, and the elastic portion, which is located between the first holding portion and the slope, increase the contact pressure of the first plunger on the second plunger. Thus, the probe pin can have high contact stability.

The first and second plungers have a simple structure, and can thus be designed freely to have intended dimensions including width and length for easily achieving a probe pin that is smaller and thinner.

In a probe pin according to a second aspect of the present invention, the first plunger body has a rectangular cross-section. The first plunger body includes the slope on a surface on a shorter side in a cross-section of the first plunger body, and a first engagement portion that protrudes from a free end of the slope. The second plunger includes a second engagement portion engaged with the first engagement portion. The first engagement portion and the second engagement portion are engaged with each other to allow the second plunger to come into contact with the slope and a surface on a longer side in the cross-section of the first plunger body.

In other words, in the probe pin according to the second aspect, the first plunger and the second plunger are plate-like. The first plunger body includes a distal end that is away from the first terminal and includes a first engagement portion protruding from a surface of the first plunger body. The second plunger body includes a distal end that is away from the second terminal and includes a second engagement portion protruding from a surface of the second plunger body and engageable with the first engagement portion. The first engagement portion and the second engagement portion protrude in directions crossing each other and are engaged with each other.

The probe pin according to the second aspect has a simple shape, and can thus be easily manufactured by a method other than electroforming.

The first and second engagement portions are engaged with each other to allow the second plunger to come into contact with the slope and a surface of the first plunger body on a longer side in the cross-section of the first plunger body. More specifically, when the first and second engagement portions are engaged with each other, the first and second plunger bodies come into contact with each other on their two surfaces adjacent to each other. This structure may prevent the first and second plungers from coming off from each other, and increases the contact area between the first and second plungers. The probe pin thus has high contact reliability.

In a probe pin according to a third aspect of the present invention, the first plunger body has a rectangular cross-section. The first plunger body includes the slope on a surface on a shorter side in a cross-section of the first plunger body, and a first engagement portion that protrudes from a free end of the slope. The second plunger includes a second engagement portion engaged with the first engagement portion. The first engagement portion and the second engagement portion are engaged with each other to allow the second plunger to come into contact with only the surface on the shorter side in the cross-section of the first plunger body.

In other words, in the probe pin according to the third aspect, the first plunger and the second plunger are plate-like. The first plunger body includes a distal end that is away from the first terminal and includes a first engagement portion protruding from a surface of the first plunger body. The second plunger body includes a distal end that is away from the second terminal and includes a second engagement portion protruding from a surface of the second plunger body and engageable with the first engagement portion. The first engagement portion and the second engagement portion protrude in directions parallel to each other and are engaged with each other.

In the probe pin according to the third aspect, the first and second engagement portions are urged in opposite directions. This structure can exert a higher contact pressure on the contact surfaces of the first and second plungers, and can thus improve the contact stability.

In a probe pin according to a fourth aspect of the present invention, the first plunger includes a first terminal extending from the first plunger body outside the elastic hollow cylinder along the central axis. The elastic portion in the first plunger body includes the base including a thin neck that bends and protrudes in a direction perpendicular to the central axis.

In other words, in the probe pin according to the fourth aspect, the elastic portion in the first plunger body bends and protrudes in a direction perpendicular to the central axis.

In the probe pin according to the fourth aspect, the elastic portion can be formed from a material having a small elastic force, which is selectable from a wider variety of materials.

In a probe pin according to a fifth aspect of the present invention, the first plunger includes a first terminal extending from the first plunger body outside the elastic hollow cylinder along the central axis. The elastic portion in the first plunger body curves in an axial direction of the central axis from a base of the first plunger body.

In other words, in the probe pin according to the fifth aspect, the elastic portion in the first plunger body curves around the central axis.

The probe pin according to the fifth aspect includes the curving elastic portion that is elastically deformed with a small urging force. This structure disperses stress applied on the elastic portion. The probe pin can thus have a longer life.

In a probe pin according to a sixth aspect of the present invention, the first plunger includes a first terminal extending from the first plunger body outside the elastic hollow cylinder along the central axis. The elastic portion in the first plunger body curves in a direction perpendicular to the central axis from a base of the first plunger body.

In other words, in the probe pin according to the sixth aspect, the elastic portion in the first plunger body curves in a direction perpendicular to the central axis.

The probe pin according to the sixth aspect includes the curving elastic portion that is elastically deformed with a small urging force. This structure disperses stress applied on the elastic portion. The probe pin can thus have a longer life.

In a probe pin according to a seventh aspect, the first plunger includes a first terminal extending from the first plunger body outside the elastic hollow cylinder along the central axis. The first plunger body includes a slit extending from the base in an axial direction of the central axis.

In other words, in the probe pin according to the seventh aspect, the first plunger body includes a slit extending along the central axis.

The probe pin according to the seventh aspect can adjust the elastic force of the first plunger body using the slit. The probe pin having the slit thus has an elastic force appropriately adjusted for each inspection device.

In a probe pin according to an eighth aspect of the present invention, the first plunger includes a first terminal extending from the first plunger body outside the elastic hollow cylinder along the central axis. The first terminal has a rectangular cross-section, and includes a holding portion that protrudes from a surface on a shorter side in a cross-section at a base of the first terminal, and that holds an end portion of the elastic hollow cylinder.

In other words, in the probe pin according to the eighth aspect, the first plunger further includes a first holding portion located in a portion where the first plunger body meets the first terminal and extending in a direction crossing the central axis. The first holding portion is in contact with the first end of the elastic hollow cylinder to hold the elastic hollow cylinder and prevent the elastic hollow cylinder from coming off.

In the probe pin according to the eighth aspect, the first holding portion may prevent the elastic hollow cylinder from coming off, and ease the handling in an assembly process, and thus increase the production efficiency.

In a probe pin according to a ninth aspect of the present invention, the second plunger includes a second plunger body having a rectangular cross-section, extending along the central axis, and sliding over the first plunger in the elastic hollow cylinder, and a second terminal extending from the second plunger body outside the elastic hollow cylinder along the central axis.

In other words, in the probe pin according to the ninth aspect, the second plunger further includes a second holding portion located in a portion where the second plunger body meets the second terminal and extending in a direction crossing the central axis. The second holding portion is in contact with the second end of the elastic hollow cylinder to hold the elastic hollow cylinder and prevent the elastic hollow cylinder from coming off.

In the probe pin according to the ninth aspect, the first and second holding portions may prevent the elastic hollow cylinder from coming off, and ease the handling in an assembly process, and thus increase the production efficiency.

In a probe pin according to a tenth aspect of the present invention, the first plunger body and the second plunger body have different lengths in an axial direction of the central axis.

In other words, in the probe pin according to the tenth aspect, the first plunger body and the second plunger body have different lengths along the central axis.

In the probe pin according to the tenth aspect, for example, the first plunger has a larger length than the second plunger to enlarge an elastic portion and disperse stress applied on the elastic portion. The probe pin can thus have a longer life.

In a probe pin according to an eleventh aspect of the present invention, the second plunger has the same shape as the first plunger according to any one of the first to tenth aspects.

In other words, in the probe pin according to the eleventh aspect, the first plunger and the second plunger have the same shape.

In the probe pin according to the eleventh aspect, the first and second plungers have the same shape, and are thus easily manufactured at low costs. The shape of the second plunger can be flexibly changed in various manners in accordance with an intended elastic force.

In an inspection device according to a twelfth aspect of the present invention, a part of the probe pin according to any one of the first to eleventh aspects is contained in a housing.

In other words, the inspection device according to the twelfth aspect includes the probe pin and a housing containing the probe pin.

The inspection device according to the twelfth aspect including the probe pin can have high contact stability. With the probe pin smaller or thinner than an existing probe pin, the inspection device can inspect narrowly-spaced test portions in a semiconductor integrated circuit.

Any of the above embodiments or modifications may be combined to produce their advantages. The embodiments may be combined with one another, the modifications may be combined with one another, or any embodiment(s) and any modification(s) may be combined with one another. Moreover, the features in different embodiments or modifications may be combined.

Although the present invention is fully described in relation to preferable embodiments with reference to the attached drawings, modifications or changes to the present invention are apparent to those skilled in the art. Such modifications or changes should be understood as being included in the present invention without departing from the scope of the present invention, defined by the appended claims.

INDUSTRIAL APPLICABILITY

The probe pin according to the embodiments of the present invention is applicable to other inspection devices or electronic devices, in addition to the inspection devices according to the above embodiments.

The inspection device according to the embodiments of the present invention is also usable for inspecting, for example, the electric characteristics of semiconductor integrated circuits such as IC chips.

REFERENCE SIGNS LIST 10 inspection device
15 probe pin
20 housing
21 base
22 storage hole
23 first terminal opening
24 opening edge of first terminal opening 23
25 cover
26 second terminal opening
27 opening edge of second terminal opening 26
30 first plunger
31 first plunger body
32 first terminal
33, 33a, 33b first elastic portion (elastic portion)
33c first slit
34 first engagement portion
35 first slope (slope)
36 first holding portion
37 first contact surface
37a first slope
37b first end surface
40 second plunger
41 second plunger body
42 second terminal
43, 43a, 43b second elastic portion
43c second slit
44 second engagement portion
45 second slope
46 second holding portion
46 second contact surface
47a flat surface
47b second end surface
50 coil spring (elastic hollow cylinder)
a central axis

The invention claimed is:
1. A probe pin, comprising:
an elastic hollow cylinder configured to expand and contract along a central axis;
a conductive first plunger extending in the elastic hollow cylinder along the central axis from a first end of the elastic hollow cylinder; and
a conductive second plunger extending in the elastic hollow cylinder along the central axis from a second end of the elastic hollow cylinder, wherein:
the first plunger and the second plunger are coupled together in the elastic hollow cylinder in a manner movable relative to each other along the central axis;
the first plunger comprises:
a first plunger body located in the elastic hollow cylinder; and
a first terminal connected to the first plunger body, and located outside the elastic hollow cylinder;
the second plunger comprises:
a second plunger body located in the elastic hollow cylinder; and
a second terminal connected to the second plunger body, and located outside the elastic hollow cylinder;
the first plunger body comprises:
a slope that tapers in a direction from an outer side toward an inner side of the elastic hollow cylinder, the slope configured to come in contact with the second plunger body inside the elastic hollow cylinder, and configured to be urged in a direction crossing the central axis by relative movement of the first plunger and the second plunger; and
an elastic portion located between the first terminal and the slope and elastically deformable; and
the elastic portion in the first plunger body bends and protrudes in a direction perpendicular to the central axis.

2. The probe pin according to claim 1, wherein
the first plunger further comprises a first holding portion located in a portion where the first plunger body meets the first terminal and extending in a direction crossing the central axis, and the first holding portion is in contact with the first end of the elastic hollow cylinder to hold the elastic hollow cylinder and prevent the elastic hollow cylinder from coming off.

3. The probe pin according to claim 2, wherein
the second plunger further comprises a second holding portion located in a portion where the second plunger body meets the second terminal and extending in a direction crossing the central axis, and the second holding portion is in contact with the second end of the elastic hollow cylinder to hold the elastic hollow cylinder and prevent the elastic hollow cylinder from coming off.

4. The probe pin according to claim 1, wherein the first plunger body and the second plunger body have different lengths along the central axis.

5. The probe pin according to claim 1, wherein the first plunger and the second plunger have the same shape.

6. An inspection device, comprising:
the probe pin according to claim 1; and
a housing containing the probe pin.

7. A probe pin, comprising:
an elastic hollow cylinder configured to expand and contract along a central axis;
a conductive first plunger extending in the elastic hollow cylinder along the central axis from a first end of the elastic hollow cylinder; and
a conductive second plunger extending in the elastic hollow cylinder along the central axis from a second end of the elastic hollow cylinder, wherein:
the first plunger and the second plunger are coupled together in the elastic hollow cylinder in a manner movable relative to each other along the central axis;
the first plunger comprises:
   a first plunger body located in the elastic hollow cylinder; and
   a first terminal connected to the first plunger body, and located outside the elastic hollow cylinder;
the second plunger comprises:
   a second plunger body located in the elastic hollow cylinder; and
   a second terminal connected to the second plunger body, and located outside the elastic hollow cylinder;
the first plunger body comprises:
   a slope that tapers in a direction from an outer side toward an inner side of the elastic hollow cylinder, the slope configured to come in contact with the second plunger body inside the elastic hollow cylinder, and configured to be urged in a direction crossing the central axis by relative movement of the first plunger and the second plunger;
   an elastic portion located between the first terminal and the slope and is elastically deformable; and
   the elastic portion in the first plunger body includes a meandering shape which meanders along a direction perpendicular to the central axis.

\* \* \* \* \*